United States Patent [19]

Holzman

[11] Patent Number: 5,109,269
[45] Date of Patent: Apr. 28, 1992

[54] METHOD AND MEANS FOR POSITIONING SURFACE MOUNTED ELECTRONIC COMPONENTS ON A PRINTED WIRING BOARD

[76] Inventor: Ofer Holzman, 2787 Parkview Dr., Thousand Oaks, Calif. 91362

[21] Appl. No.: 726,780

[22] Filed: Jul. 8, 1991

[51] Int. Cl.⁵ .................. H01L 23/02; H01L 39/02; H01L 23/58; H05K 7/10
[52] U.S. Cl. ............................. 357/74; 357/80; 357/28; 357/70; 269/903; 174/52.4; 437/924; 437/204; 437/209; 29/840; 361/403; 439/83
[58] Field of Search ............. 357/74, 80, 28, 70; 269/903; 174/52.4; 437/924, 204, 209; 29/840; 361/400, 403; 439/83

[56] References Cited

U.S. PATENT DOCUMENTS 4,595,794 6/1986 Wasserman ................. 361/403
4,831,724 5/1989 Elliott ........................ 29/840

Primary Examiner—Rolf Hille
Assistant Examiner—Robert P. Limanek
Attorney, Agent, or Firm—Robert L. Finkel

[57] ABSTRACT

An SMT electronic component is mounted to a solder-bearing floatation plate by fusible or other heat-responsive releasable mounting means which suspend the component above the floatation plate. The bottom of the floatation plate is effectively substantially the mirror image of a component-positioning pad formed on the board surface adjacent the solder-bearing contact pads corresponding to the electrical contacts on the component. In the assembly process, the floatation plate is placed on the positioning pad. The solder on the bottom of the floatation plate has a melting point lower than the release temperature of the mounting means and the melting point of the solder on the contact pads. With the floatation plate on the component-positioning pad, on heating the solder on the floatation plate liquifies first, wetting the component-positioning pad and floating the floatation plate and component on a thin film of molten solder. Surface tension forces bring the floatation plate into registry with the component-positioning pad. On further heating, the solder on the contact pads liquifies, and the heat-responsive mounting means allows the component to fall freely onto the contact pads. Guide means are provided to prevent rotational and lateral displacement of the component during the fall. The disclosure includes alternative floatation plate constructions and component mounting arrangements.

25 Claims, 5 Drawing Sheets

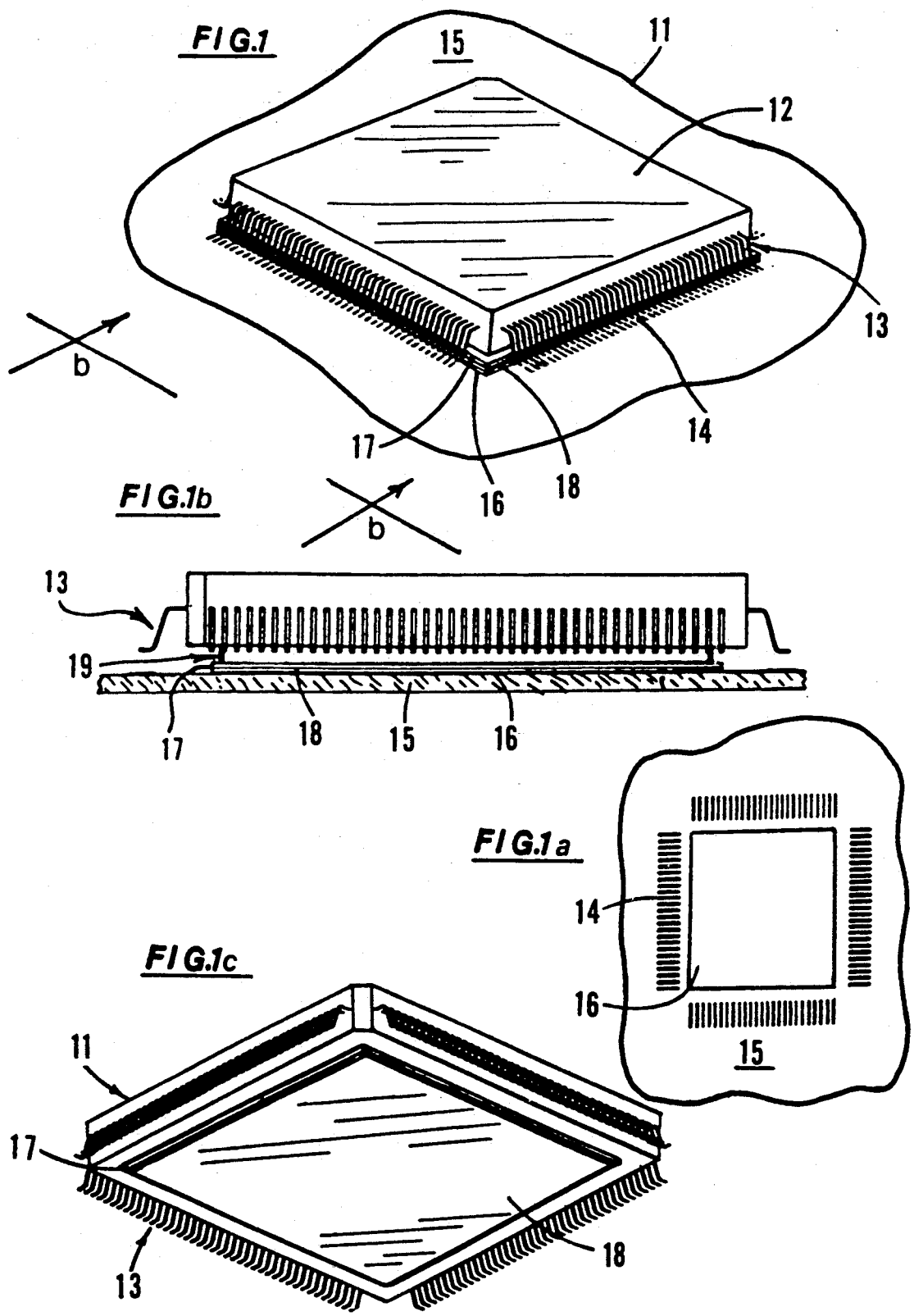

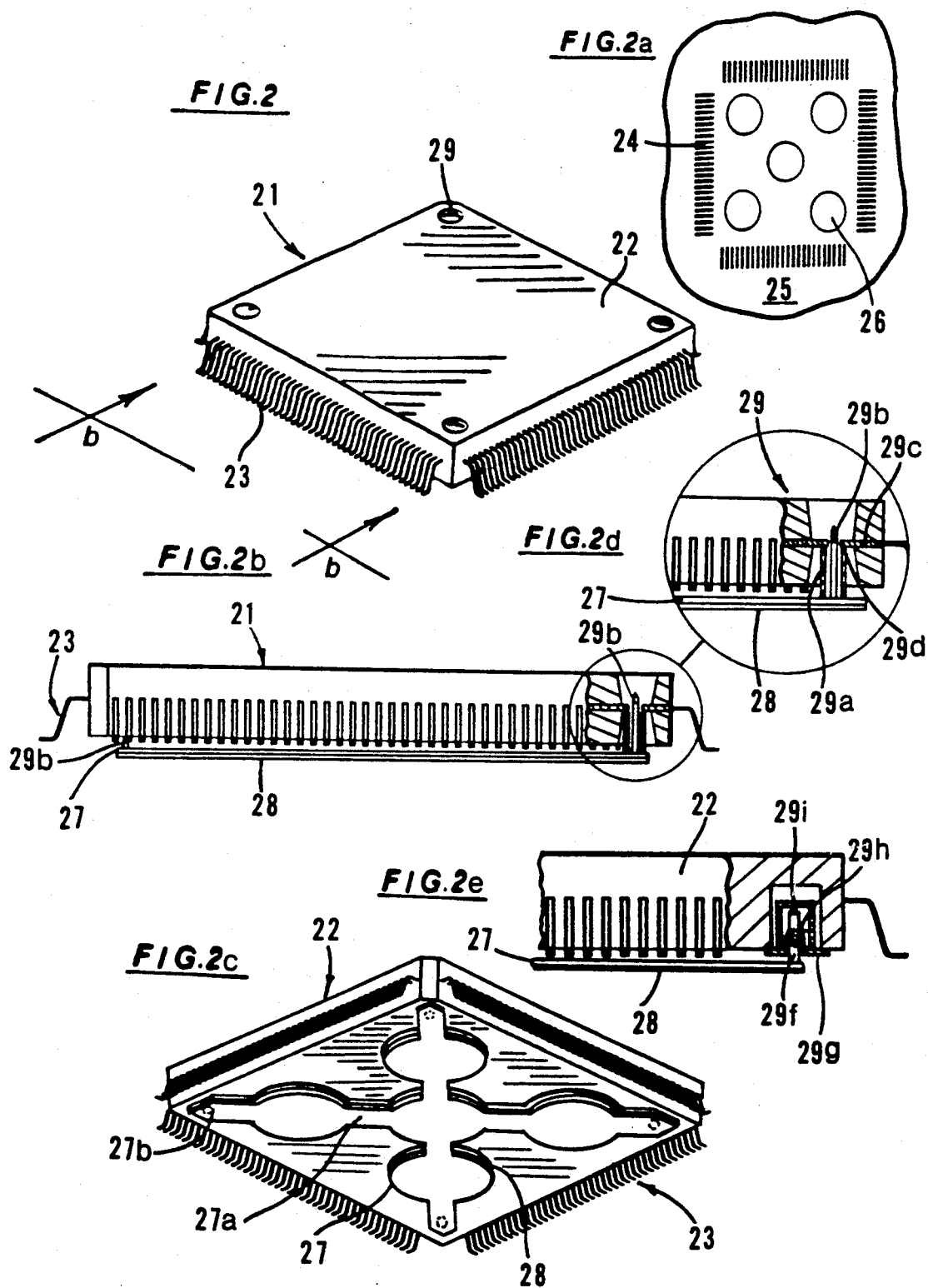

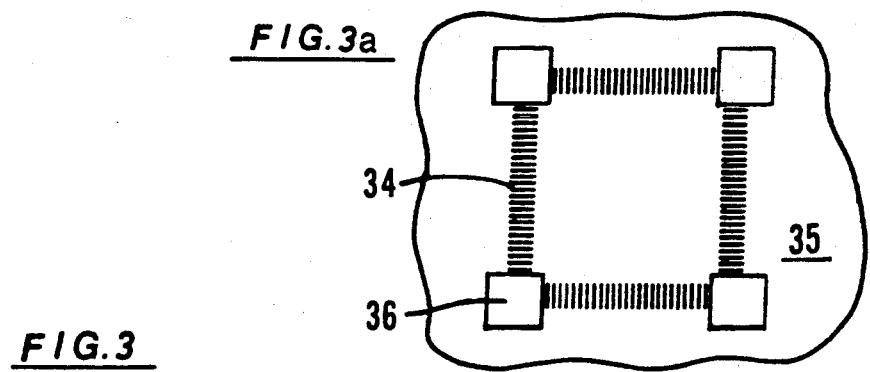
FIG. 3a
FIG. 3
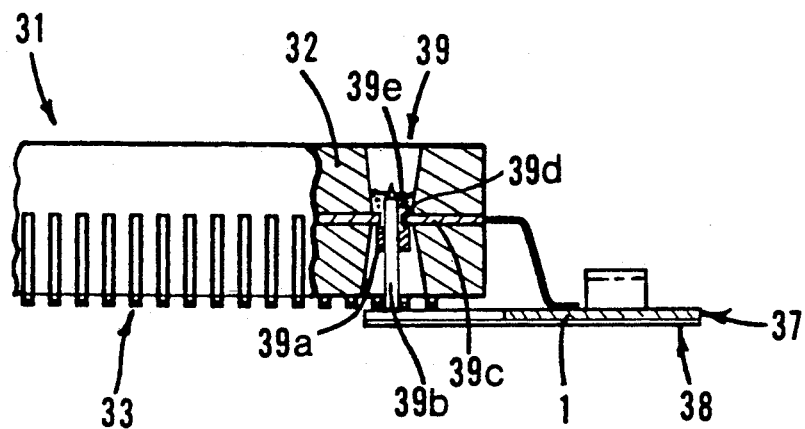
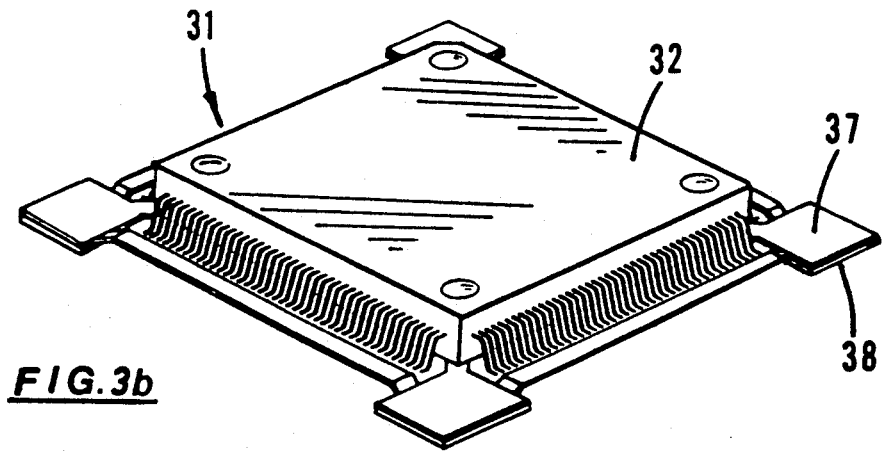
FIG. 3b

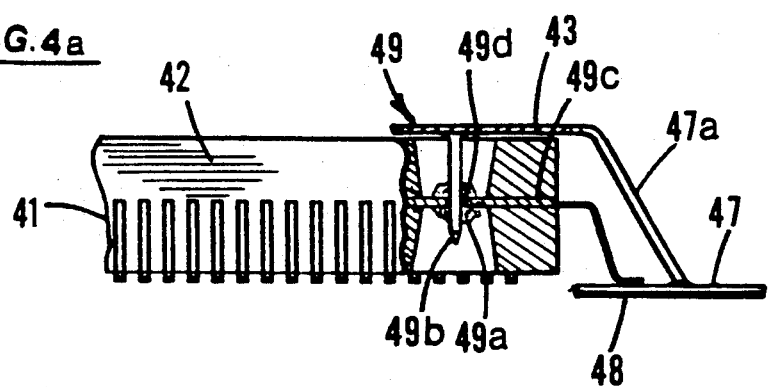
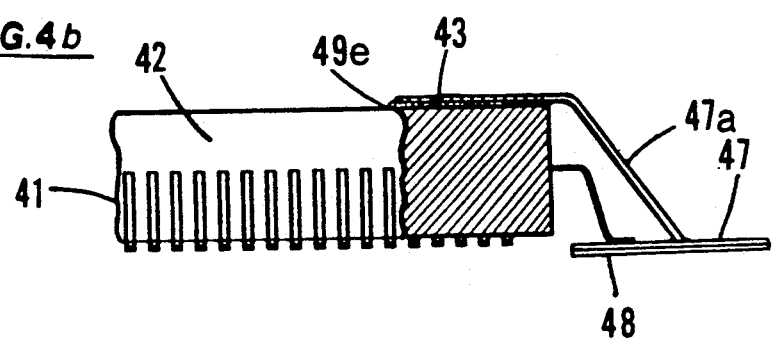
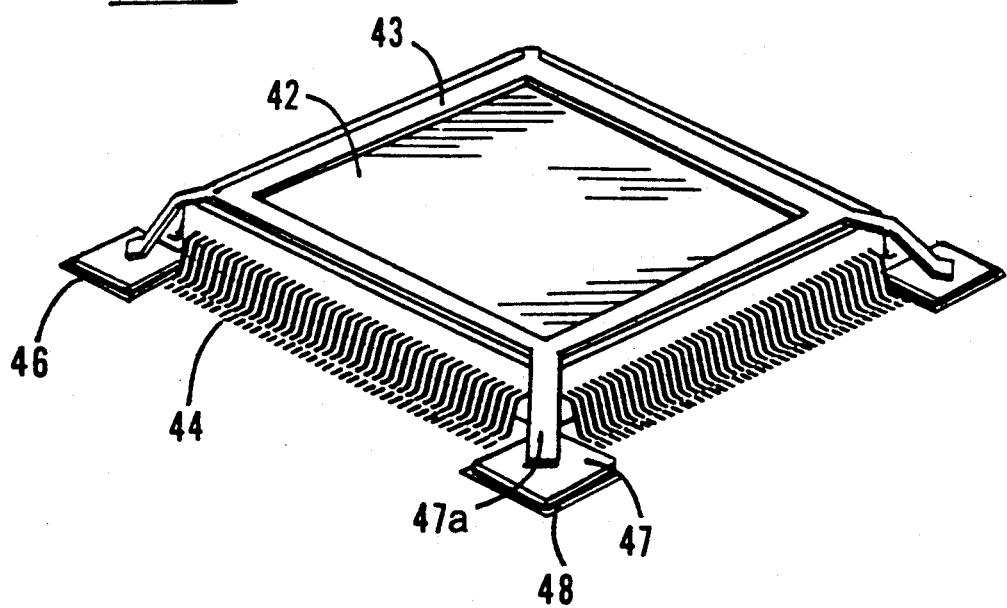

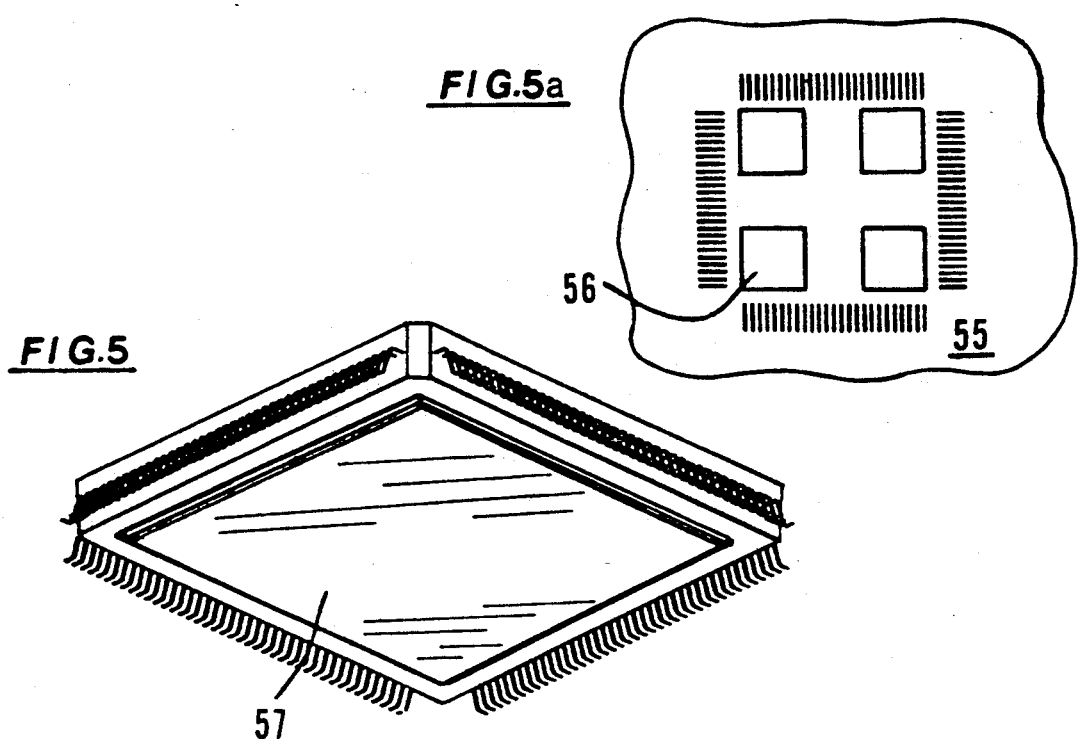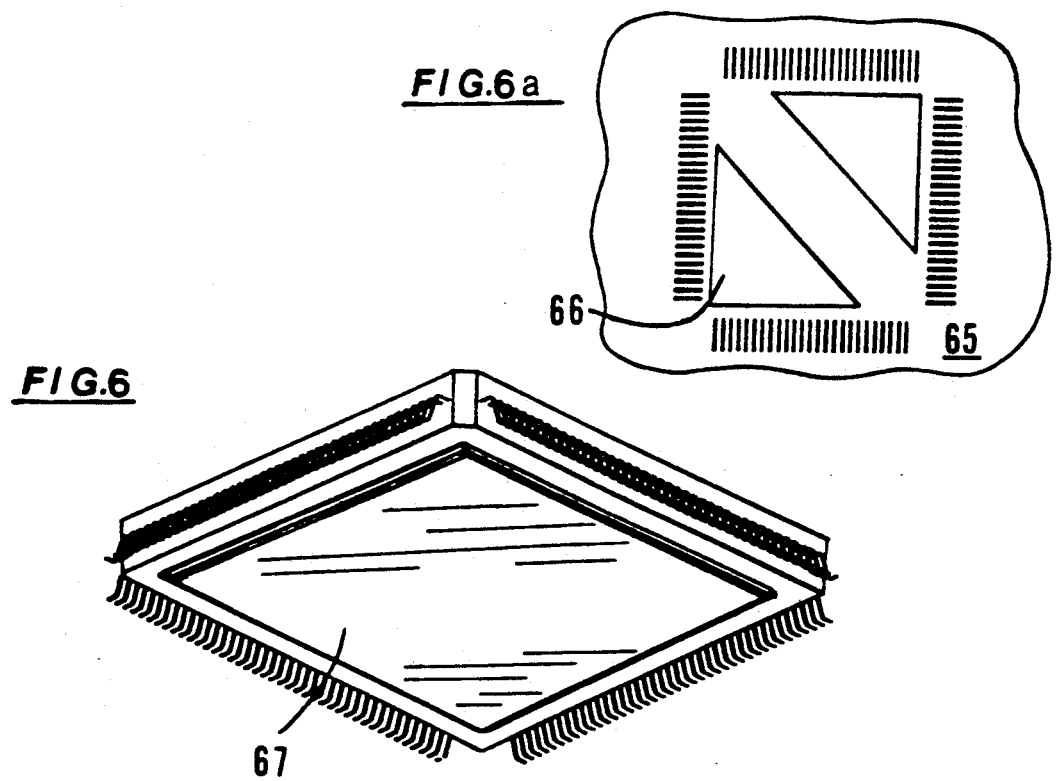

METHOD AND MEANS FOR POSITIONING SURFACE MOUNTED ELECTRONIC COMPONENTS ON A PRINTED WIRING BOARD

BACKGROUND

1. Field of the Invention

This invention relates to methods and means for positioning surface mounted electronic components, especially fine pitch components, on the surface of a printed wiring board. More particularly, it is concerned with methods and means which employ surface tension effects for precisely positioning electronic components on a printed wiring board during the assembly process.

2. Prior Art

Fine pitch surface mounted electronic components with lead spacing of 0.040" or less offer a number of advantages over conventional 50 mil-spaced components in addition to small size. These include, among others, increased input and output handling capacity, enhanced throughput speed, relatively low cost, and the potential for substantial reductions in the cost of integrated systems adapted to utilize fine pitch technology.

Unfortunately, the characteristics that provide these advantages, small size, high lead count and close lead spacing, are the source of a number of significant disadvantages as well. By way of example, lead-to-pad misregistration, solder bridging, and slumping, all relatively minor, fairly easily avoided annoyances with 50-mil on center components, become major problems when pad spacing gets down to 40-mils or less.

To some extent these problems can be overcome or alleviated by conventional means, such as taking pains to improve the quality of the circuit artwork, providing for greater consistency in solder plating on the contact pads, paying special attention to circuit and pad geometry, exercising more effective control over the solder reflow process, and the like. But greater precision, special handling and enhanced quality control are costly. Ultimately, the conflicting demands of miniaturization and cost-effectiveness can be satisfied only by improving the accuracy with which the components are positioned on the board surface.

Heretofore, the usual approach to improving placement accuracy has been to design ever more sophisticated pick-and-place machines. Computer controlled and provided with remote monitors and elaborate robotics, these high output precision machines are so costly to manufacture, complicated to use and difficult to maintain and repair they are for all practical intents and purposes out of the reach of many potential users. The subject invention represents a totally different approach.

One of the objects of the invention is to provide a novel method and a family of unique devices for accurately positioning surface mounted components, particularly fine-pitch components, on the board surface without need for elaborate high precision pick-and-place equipment.

Another object is to provide a method and means for accurately positioning components, which employ surface tension principles in place of customary prior art pick-and-place techniques.

Yet another object is to provide a method and means for positioning surface mounted components, that require a minimum of human intervention.

Still another object is to furnish a family of high-precision positioning devices that are readily adaptable for use with a variety of surface mounted components.

A further object is to provide a line of such devices that are inexpensive to manufacture, simple to use and substantially free from maintenance and repair needs.

Other objects will become apparent from the following summary of the invention and detailed description of several of its preferred embodiments.

SUMMARY OF THE INVENTION

On a conventional printed wiring board the location or "footprint" of an electronic component on the board surface is defined by metallic contact pads formed on the surface in a pattern corresponding to the layout of the terminal leads or other electrical contacts on the component. In production, the pads are chemically cleaned and tinned or otherwise conventionally treated to make them "solderable," that is, capable of being wetted by molten solder. Then solder is applied to the pads by conventional means, for example, as a stencilled and the components are mounted to the board with their leads or contacts resting on their associated pads in readiness for solder bonding by reflow, infrared heating, or other conventional means.

In a preferred embodiment of the invention, the wiring board is substantially indistinguishable from a conventional board, except for the provision of a one or more novel component-positioning pads in conjunction with the footprint of each component. In many instances, these positioning pads can be retrofitted into an existing printed wiring layout with little or no design modification. With new wiring designs, the component-positioning pads are easily integrated into the board layout at its inception.

In the subject invention, a surface mounted electronic component is mounted to what I call a "floatation plate." As its name suggests, the floatation plate is intended to serve as a kind of specialized raft for the component.

The generally flat bottom of the floatation plate is effectively substantially the mirror image of the plan shape of the component-positioning pad for that component on the board surface. By this I mean, the overall peripheral shape of the pad or pads on the board surface and the overall peripheral shape of the floatation plates are substantially similar, even though each is made up of individual parts or segments of dissimilar shapes or sizes, respectively. Preferably, though not necessarily, the floatation plate is more or less the same size as the positioning pad. The bottom of the plate is solderable, and bears a layer or shim of solder in solid or paste form.

Fusible, or other heat-responsive mounting means on the floatation plate support or suspend the component at a height above the bottom surface of the plate, that is, at a height above the surface of the board. The mounting means is adapted to release the component when the temperature of the mounting means, ("release temperature") reaches the melting point of the solder on the contact pad or pads. The solder on the bottom of the floatation plate has a melting point lower than the release temperature of the mounting means and lower than the melting point of the solder on the contact pads associated with the component.

In production, the floatation plate with the component mounted to it is placed on the prepared board by convenient assembly means, the principal requirement being that the plate be located roughly on its associated component-positioning pad. Since great precision is not required in placing the plates, the board can be populated using relatively unsophisticated pick-and-place equipment, or even by hand, if circumstances warrant.

The assembled board is processed in much the same manner as a board assembled by conventional means, the next step being reflow, infrared, or some other method of heating. On heating, the solder on the floatation plate liquifies first, wetting the component-positioning pad. The floatation plate with its component cargo is buoyantly supported on the thin film of liquid solder. The floating plate is free to move virtually frictionlessly on the positioning pad. Asymmetrical surface tension forces created in the film by any rotational or translational displacement of the floatation plate with respect to the positioning pad quickly reposition and reorient the plate to establish a state of equilibrium. The effect is to bring the floatation plate into precise symmetrical registry with the component-positioning pad. To take advantage of this effect, in designing the board layout care is taken to locate and orient the component-positioning pad so that when the floatation plate is in symmetrical registry with the positioning pad, the component on the floatation plate is in registry with the footprint of the component on the surface.

On further heating, the solder on the contact pads liquifies and the heat-responsive mounting means releases the component, allowing it to fall freely onto the board surface. As the floatation plate is oriented, the component leads or contacts should land precisely on the contact pads. In some instances, however, external influences, such as unavoidable vibration or irregular motion in the processing line may effect the trajectory or orientation of the falling component. To prevent this, in several alternative embodiments of the invention guide means are provided to prevent rotational and lateral displacement of the component during the fall.

To compensate for and accommodate variations in component structures and surface mounting characteristics and requirements, the invention encompasses alternative floatation plate constructions and component mounting arrangements. By way of example, as indicated earlier the invention can be adapted as readily for use with biaxial devices having metallized termination areas as to components, such as gullwing-lead devices or quad packages having terminal lead contacts. It will be understood, therefore, that when I use the term "contact" with reference to a surface mounted device, I intend to embrace all types of electrical contact structures, including but not limited to conductive surfaces, plates, and leads.

For a fuller understanding of the invention, reference is made to the accompanying drawings, in which:

BRIEF DESCRIPTION OF THE DRAWINGS

FIG. 1 is a fragmentary top perspective view of a typical surface mounted electronic component embodying the invention, positioned on a printed wiring board in anticipation of initial heating;

FIG. 1a is a reduced fragmentary top plan view of the printed wiring board of FIG. showing the footprint of the component of FIG. 1;

FIG. 1b is a side elevational view of the component of FIG. 1, taken along the line b—b;

FIG. 1c is a bottom perspective view of the component of FIG. 1;

FIG. 2 is a top perspective view of another typical surface mounted electronic component illustrating an alternative embodiment of the subject invention;

FIG. 2a is a reduced fragmentary top plan view of a printed wiring board embodying the subject invention, showing the footprint of the component of FIG. 2;

FIG. 2b is a side elevational view of the component of FIG. 2, taken in the direction b—b;

FIG. 2c is a bottom perspective view of the component of FIG. 2;

FIG. 2d is an enlarged fragmentary side sectional view of the region shown in section in FIG. 2b, illustrating one embodiment of the "landing means" of the subject invention;

FIG. 2e is an enlarged fragmentary side sectional view of another typical component, illustrating an alternative embodiment of the "landing means" of the subject invention;

FIG. 3 is a fragmentary side elevational view of yet another typical component, with portions cut away to illustrate a second alternative embodiment of the "landing means" of the subject invention;

FIG. 3a is a reduced fragmentary top plan view of a printed wiring board embodying the subject invention, showing the footprint of the component of FIG. 3;

FIG. 3b is a top perspective view of the electronic component of FIG. 3;

FIG. 4 is a top perspective view of still another embodiment of the subject invention;

FIG. 4a is a fragmentary side elevational view of the component of FIG. 4, with a portion cut away to illustrate a third alternative embodiment of the "landing means" of the subject invention;

FIG. 4b is a fragmentary side elevational view of a component similar to that of FIG. 4, with a portion cut away to illustrate a fourth alternative embodiment of the "landing means" of the subject invention; and FIG. 5 is a bottom perspective view of another typical component embodying the subject invention; and FIG. 5a is a reduced fragmentary top plan view of a printed wiring board, showing a footprint for the component of FIG. 5;

FIG. 6 is a bottom perspective view of another typical component embodying the subject invention; and FIG. 6a is a reduced, fragmentary top plan view of a printed wiring board, showing an alternative footprint for the component of FIG. 6.

DETAILED DESCRIPTION OF THE PREFERRED EMBODIMENTS

Referring to FIGS. 1-1c, a typical leaded fine pitch surface mounted electronic component 11 comprises a non-conductive housing 12 encapsulating the device itself, and a plurality of conductive terminal leads 13 extending outwardly and downwardly from the housing 12 to make electrical connection with the conductive traces and pads 14 which give the printed wiring board 15 its name. In other types of components, such as biaxial devices (not shown) contact is made with the traces and pads on the board through conductive areas on the surface of the device or through other structural terminals, rather than through leads. For convenience, I shall describe the invention as it is exemplified by the leaded type of component, but the reader will understand that it is applicable to other types of devices as well.

In designing the artwork for the printed wiring board 15, provision is made for a component-positioning pad 16 to accommodate the floatation plate 17. Advantageously, plate 17 is made of sheet metal, preferably a lightweight metal, such as aluminum, which can be formed by precision-stamping or photochemical etching. The pad design and precise location with respect to the component footprint must take into account the size, shape, weight and other pertinent characteristics of the component 11, as well as the layout of the footprint and the surrounding circuit features.

As far as I can ascertain, the shape of the pad 16 is a matter of choice. For single pads, I prefer to use simple regular geometric figures, principally squares, rectangles and equilateral triangles. Clearly, since the purpose of the pad 16 is to provide angular as well as lateral orientation to the floatation plate 17, an individual circular positioning pad 16 or plate 17 would have limited utility. As will be shown shortly, in some instances it is useful or necessary to provide a positioning pad or floatation plate of more complex design. Whatever the design, preferably the pad 16 and plate 17 are adapted to place the center of mass of the component 11 as close to the center of the footprint as possible.

Preferably, the bottom of floatation plate 17 is formed as the substantial mirror image of the component positioning pad 16. A small disparity in size between plate 17 and pad 16 will not seriously denigrate the operation of the invention. To the contrary, I believe, but I am by no means certain, that an overlap of about 10 mils by one or the other of the two elements may be advantageous. As I shall explain below, in some instances it is even possible to use pads and plates of differing sizes and shapes to achieve the same result.

In the embodiment of FIG. 1-1c, component 11 is releasably mounted to floatation plate 17 by corner posts 19 or a connecting shim (not shown) of solder, fusible epoxy or other suitable heat-responsive material, secured by conventional means, for example adhesive bonding, to the top of plate 17 and the underside of component 11.

In mounting the component 11 to the floatation plate 17, conveniently, plate 17 is chrome, tin, or tin-lead plated for solderability and a shim of solder 18 is attached to its plated bottom surface. The corner posts 19 or connecting shim which will mount the component 11 to plate 17 are then bonded to the upper side of plate 17. A layer of adhesive, preferably a high temperature-resisting epoxy, is applied to the tops of posts 19 or the upper surface of the connecting shim. At this point, a conventional vision assisted alignment machine is employed to align component 11 precisely with plate 17 and bring the posts 19 or shim and the component 11 into bonding contact. When the epoxy has hardened and cured, the plate 17 and component 11 form a unitary package with the component's leads 13 in perfect alignment with plate 17.

Conventionally, the electrical contact pads 14 on a printed wiring board 15 have a melting point of about 216° C. To insure compatibility of the subject invention with existing production equipment, and especially with existing reflow facilities and furnaces, this temperature is targeted as the "release temperature" of the posts 19 and connecting shim mounting the component 11 to floatation plate 17. Preferably, the solder 18 on the bottom of plate 17 has a melting point of about 140° C.

After assembly, with plate 17 roughly positioned on pad 16, heating the package to 140° C., for example in an infrared furnace, liquifies the shim 18. The molten solder wets pad 16 and floats plate 17 and component 11. Surface tension centers and orients plate 17 on pad 16. Further heating to a temperature of about 216° C. fuses the posts 19 or the connecting shim supporting the component 11 and allows the component to fall freely onto board 15, each of the leads 13 landing precisely on its respective contact pad 14.

Aside from the provision of positioning pads on the board surface, the only change in existing practice my invention will call for is a slight modification in the design and construction of the electronic components used with my self-aligning floatation devices. To allow space for the floatation plate 17 after the component 11 lands on the board 15, the leads 13 will have to be lengthened or reformed so as to elevate the component an additional approximately 20 mils. above the board surface.

The embodiment of FIGS. 1-1c is quite adequate for applications which do not call for a high degree of precision or repeatability in component placement. Where precise placement and reliability are needed, however, pains must be taken to insure that the orientation and trajectory of the component are not disturbed while it is falling to the board surface. The embodiments of the invention shown in FIGS. 2-2e provide a pair of illustrative guidance mechanisms or landing devices for achieving that result.

Outwardly, the only evidence of the presence of the landing device of FIG. 2d visible on examination of component 21 are the access ports in the four corners of the housing 22. The device of FIG. 2e is virtually undetectable. Neither of the landing devices shown requires a major modification of the basic design of any existing electronic component to which these devices can be applied.

Referring to FIG. 2d, an upstanding alignment pin 29b is welded or brazed to the floatation plate 27. In mounting the component 21 to plate 27, the pins 29b are inserted into alignment holes 29d provided in some convenient part 29c of the structure of the component. No additional alignment will be needed during the mounting process.

Preferably the part 29c is of sufficient thickness to serve as a sleeve for guiding the pins 29b when the component 21 is in free-fall.

In this embodiment of the invention, the component 21 is mounted to plate 27 by means of a fusible sleeve 29a bonded to plate 27 and component 21. The fuse point or release temperature of sleeve 29a is well above the melting point of the solder 28 on the bottom of plate 27. Preferably it is the same as the melting point of contact pads 24, 216° C., and the melting point of the solder 28 is about 140° C., as in the previous embodiment.

In the embodiment of FIG. 2e, the component 21 is mounted to the plate 27 by means of an upstanding pin 29f secured to plate 27. Pin 29f passes through a small opening in a washer 29g bonded by an appropriate adhesive to the underside of component 21. A bead 29h of solder, wax, adhesive, or the like, having a relatively high melting point supports plate 27 on washer 29g. An inverted cup 29i of fusible material secured to the top of washer 29g acts as a spacer to support component 21 on plate 27. The melting point of cup 29i is relatively high, preferably on the order of about 216° C. Again, as in the two previous examples, the melting point of the solder 28 on the bottom of plate 27 is well below that of the releasable mounting means 29i, and preferably about 140° C.

The package defined by plate 27 and component 21 is provided with an array of floatation pads 26. Plate 27 is stamped out of a sheet of metal as a unitary element. It will be noted that the presence of relatively small features, such as webs 27a and tabs 27b, in addition to the principal design features of the positioning pad or pads is believed to have little if any adverse effect on the self-aligning ability of the device. Positioned on its floatation pads 26, on initial heating to the fusing point of solder 28, plate 27 and component 21 are floated on a film of solder and brought into registration with the pad array. On further heating to the melting temperature of the cup 29i, component 21 is allowed to fall onto the surface of board 25, its leads 23 in perfect registry with pads 24.

The embodiment of FIGS. 3-3b illustrates two additional features of the invention. The first is its ability to employ an array of positioning pads 36 and corresponding floatation plates 37 which extend laterally well beyond the walls of the component 31. The second is its use of two further alternative heat-sensitive mounting means, an expansion ring 39a, and a high temperature fusible or combustible adhesive, such as the well known cyano acrylic "Crazy Glue," for attaching a component 31 to the plates 37.

FIGS. 4-4b illustrate two further embodiments of the invention. As shown in FIG. 4, an array of floatation plates 47 with attached solder shims 48 on their low surfaces are connected through a superstructure 43, 47a which overarches the plates 47 and provides means for supporting a component 41 from above, rather than from below as in the previously described embodiments. In the version of FIG. 4a, a guidance device, inverted pin 49b extending through a guidance hole 49d in structural element 49c, and a high temperature fusible material 49a, serve as the attachment means. In the embodiment of FIG. 4b, the component 41 is mounted to the superstructure 43 by means of a layer of adhesive 49e such as "Crazy Glue," which either fuses or oxidizes completely at a temperature close to the 216° C. melting point of the solder on contact pads 44.

FIGS. 5, 5a, 6 and 6a illustrate the application of the principles of my invention to self-aligning devices which employ floatation plates and positioning pads whose individual components are dissimilar in sizes and shapes.

In FIG. 5a, to conserve wiring board surface 55, instead of one pad, an array of individual spaced square positioning pads 56 are provided. A single floatation plate 57 designed to conform in plan to the overall periphery of the array of pads 56 supports the electronic component. In FIG. 6a, a, rectangular plate 67 is adapted to support a component on two triangular positioning pads 66. In each instance, the plates 57, 67 are effectively substantially the mirror image of the plan shape defined by pads 56, 66 respectively. Surface tension urges the floatation plate 57,67 into a predetermined position in which the forces are in equilibrium.

While I have described my invention in terms of several preferred embodiments, it is not to be construed as limited to those embodiments, and they are to be regarded as illustrative rather than restrictive. It is my intention by this specification to encompass any and all variations of the examples I have chosen for purposes of the disclosure, which do not depart from the spirit and scope of the following claims.

I claim:

1. A self-aligning device for positioning a surface mounted electronic component having solderable electrical contacts on the surface of a printed wiring board, said printed wiring board having solderable, solder-bearing contact pads thereon conforming with said electrical contacts and having, also, at least one solderable component-positioning pad thereon associated with said contact pads, said device comprising:
   a floatation plate having a solderable, solder-bearing bottom surface substantially the mirror image of the component-positioning pad on such a printed wiring board; and
   heat-responsive mounting means on said floatation plate for mounting such a component to, and spaced above said floatation plate, said mounting means being adapted to release said component upon being heated to a temperature higher than the melting point of the solder on the bottom surface of said floatation plate, whereby when the floatation plate is on the component-positioning pad, upon the solder on the bottom surface of said floatation plate being heated to its melting point the floatation plate is urged by surface tension into registry with said component-positioning pad, and upon further heating to said higher temperature, said mounting means allow said component to fall freely onto the surface of said printed wiring board with said contacts and contact pads in registry.

2. A device in accordance with claim 1, comprising a plurality of such floatation plates.

3. A device in accordance with claim 1, comprising guide means associated with said electronic component and said floatation plate, for limiting the displacement of said component while said component is falling.

4. A device in accordance with claim 3, wherein said guide means comprises:
   a sleeve formed in said electronic component; and
   an elongated pin mounted upstandingly to said floatation plate and passing axially through said sleeve.

5. A device in accordance with claim 4, wherein:
   said mounting means comprises a fusible spacer interconnecting said floatation plate and said component, said spacer having a melting point higher than that of the solder on the bottom surface of said plate; and
   said component is supported by said member.

6. A device in accordance with claim 4, wherein:
   said mounting means comprises a joint releasably bonded by a heat-sensitive adhesive having a release point higher than the melting point of the solder on the bottom surface of said plate, and
   said component is supported by said joint.

7. A device in accordance with claim 6, wherein said adhesive is a cyano acrylic adhesive.

8. A device in accordance with claim 4, wherein:
   said mounting means comprises a releasable heat-responsive expansible retaining element having a release point higher than the melting point of the solder on the bottom surface of said plate; and
   said component is supported by said element.

9. A device in accordance with claim 8, wherein said retaining element is an expansion ring.

10. A device in accordance with claim wherein:
    said mounting means comprises a superstructure extending higher than said floatation plate; and
    said electronic component is supported dependingly on said superstructure by releasable heat-responsive support means adapted to release said component upon being heated to a temperature higher than the melting point of the solder on the bottom surface of said floatation plate.

11. A device in accordance with claim 10, wherein said heat-responsive support means includes a fusible joint having a melting point higher than that of the solder on the bottom surface of said floatation plate.

12. A self-aligning package for positioning a surface mounted electronic component having solderable electrical contacts on the surface of a printed wiring board, said printed wiring board having solderable, solder-bearing contact pads thereon conforming with said electrical contacts and at least one solderable component-positioning pad thereon associated with said contact pads, said package comprising:
   a surface mounted electronic component having solderable electrical contacts;
   a floatation plate having a solderable, solder-bearing bottom surface effectively substantially the mirror image of the component-positioning pad on such a printed wiring board; and
   heat-responsive mounting means mounting said component to, and spaced above said floatation plate, said mounting means being adapted to release said component upon being heated to a temperature higher than the melting point of the solder on the bottom surface of said floatation plate, whereby, with the floatation plate on the component-positioning pad, upon the solder on the bottom surface of said floatation plate being heated to its melting point the floatation plate is urged by surface tension into registry with said component-positioning pad, and upon further heating to said higher temperature, said mounting means allow said component to fall freely onto the surface of said printed wiring board, with said contacts and contact pads in registry.

13. An electronic package in accordance with claim 12, comprising a plurality of such floatation plates.

14. An electronic package in accordance with claim 12, comprising guide means associated with said electronic component and said floatation plate for limiting the displacement of said component while said component is falling.

15. An electronic package in accordance with claim 14, wherein said guide means comprises:
   a sleeve formed in said electronic component; and
   an elongated pin mounted upstandingly to said floatation plate and passing axially through said sleeve.

16. An electronic package in accordance with claim 14, wherein:
   said mounting means comprises a fusible spacer interconnecting said floatation plate and said component, said spacer having a melting point higher than that of the solder on the bottom surface of said plate; and
   said component is supported by said member.

17. An electronic package in accordance with claim 14, wherein:
   said mounting means comprises a joint releasably bonded by a heat-sensitive adhesive having a release point higher than the melting point of the solder on the bottom surface of said plate, and
   said component is supported by said joint.

18. An electronic package in accordance with claim 7, wherein said adhesive is a cyano acrylic adhesive.

19. An electronic package in accordance with 4, wherein:
   said mounting means comprises a heat-responsive expansible retaining element having a release point higher than the melting point of the solder on the bottom surface of said plate; and
   said component is supported by said element.

20. An electronic package in accordance with claim 19, wherein said retaining element is an expansion ring.

21. An electronic package in accordance with claim 14, wherein:
   said mounting means comprises a superstructure on said floatation plate; and
   said electronic component is supported dependingly from said superstructure by releasable heat-responsive support means adapted to release said component upon being heated to a temperature higher than the melting point of the solder on the bottom surface of said floatation plate.

22. An electronic package in accordance with claim 21, wherein said heat-responsive support means includes a fusible joint having a melting point higher than that of the solder on the bottom surface of said floatation plate.

23. The combination comprising:
   a printed wiring board having thereon an array of solderable solder-bearing electrical contact pads and a solderable component-positioning pad associated with said array;
   a surface mounted electronic component having solderable electrical contacts conforming with said array of electrical contact pads;
   a floatation plate having a solderable, solder-bearing bottom surface effectively substantially the mirror image of the component-positioning pad on such a printed wiring board; and
   heat-responsive mounting means mounting said component to, and spaced above said floatation plate, said mounting means being adapted to release said component upon being heated to a temperature higher than the melting point of the solder on the bottom surface of said floatation plate, whereby, with the floatation plate on the component-positioning pad, upon the solder on the bottom surface of said floatation plate being heated to its melting point the floatation plate is urged by surface tension into registry with said component-positioning pad, and upon further heating to said higher temperature, said mounting means allow said component to fall freely onto the surface of said printed wiring board, with said contacts and contact pads in registry.

24. A method for positioning a surface mounted electronic component having solderable electrical contacts on a printed wiring board, said printed wiring board having solderable, solder-bearing contact pads thereon conforming with said electrical contacts, said method comprising:
   providing a solderable component-positioning pad on said board in association with said contact pads;
   providing a floatation plate having a solderable solder-bearing bottom surface effectively substantially the mirror image of said component-positioning pad in mirrored plan, said floatation plate including heat sensitive mounting means adapted for mounting an electronic component to, and spaced above said floatation plate, said mounting means being further adapted on being heated to a temperature higher than the melting point of the solder on said floatation plate to release said component;

mounting an electronic component having solderable electrical contacts to said mounting means;

placing said floatation plate, with said electronic component mounted thereto, on said component-positioning pad;

heating the solder on the bottom surface of said floatation plate to its melting point, whereby said floatation plate is urged by surface tension into registry with said component-positioning pad;

thereafter heating said mounting means and the solder on said contact pads to a temperature at which the solder on said contact pads becomes liquid, and said electronic component falls onto said printed wiring board, said electrical contacts landing on said contact pads; and cooling the solder on said contact pads to a temperature at which said solder becomes solid, whereby said electronic component is securely connected, mechanically and electrically, to said printed wiring board.

25. The method of claim 24, comprising, providing guide means associated with said electronic component and said floatation plate, for limiting the displacement of said component while said component is falling.

* * * * *